(12) United States Patent
Chen (10) Patent No.: US 7,591,065 B2
(45) Date of Patent: Sep. 22, 2009

(54) ASSEMBLY SYSTEM FOR SEMICONDUCTOR PACKAGES

(75) Inventor: Ming-Yue Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/810,244

(22) Filed: Jun. 5, 2007

(65) Prior Publication Data
US 2007/0281509 A1    Dec. 6, 2007

(30) Foreign Application Priority Data
Jun. 5, 2006    (TW)    .............................. 95209738 U (51) Int. Cl.
*B23P 19/00*    (2006.01)
*H05K 13/04*    (2006.01)

(52) U.S. Cl. .............................. 29/729; 29/758; 29/759; 29/592.1; 439/73

(58) Field of Classification Search ........... 29/740–743, 29/758, 762–764, 837, 839, 739; 257/666, 257/676, 783; 324/754–764, 158.1; 269/21; 439/940, 377, 637, 83, 62–67, 330, 70
See application file for complete search history.

(56) References Cited

U.S. PATENT DOCUMENTS

| 5,100,332 | A  | * | 3/1992  | Egawa .......................... 439/72 |
| 5,232,372 | A  | * | 8/1993  | Bradley et al. ................ 439/66 |
| 5,845,385 | A  | * | 12/1998 | Foerstel ....................... 29/464 |
| 5,870,820 | A  | * | 2/1999  | Arakawa et al. ............... 29/740 |
| 6,297,654 | B1 | * | 10/2001 | Barabi ......................... 324/755 |
| 6,441,628 | B1 | * | 8/2002  | Farnworth et al. .......... 324/755 |
| 6,626,682 | B2 | * | 9/2003  | Sausen ......................... 439/70 |
| 6,784,657 | B2 | * | 8/2004  | Fujishiro et al. ......... 324/158.1 |
| 6,887,723 | B1 | * | 5/2005  | Ondricek et al. .............. 438/14 |
| 6,998,862 | B2 | * | 2/2006  | Cram .......................... 324/755 |
| 7,017,428 | B2 | * | 3/2006  | Min et al. ................... 73/865.3 |
| 7,065,868 | B2 | * | 6/2006  | Kinsman et al. ............... 29/842 |
| 2004/0112142 | A1 |   | 6/2004  | Min et al. |

* cited by examiner

*Primary Examiner*—Minh Trinh
(74) *Attorney, Agent, or Firm*—Wei Te Chung (57) ABSTRACT

An assembly for a semiconductor package comprises an electrical connector and a tool located upon the electrical connector. The electrical connector has an insulating housing and a plurality of terminals adapted for electrically connecting with the semiconductor package. The tool is formed with a body having a through hole, and a funnelform casing formed at a bottom end of the through hole for aligning and guiding the semiconductor package into the electrical connector.

8 Claims, 8 Drawing Sheets

ASSEMBLY SYSTEM FOR SEMICONDUCTOR PACKAGES

BACKGROUND OF THE INVENTION

1. Field of the Invention

The present invention relates to a tool for loading a semiconductor package, and more particularly to a tool for making the semiconductor package exactly contact with terminals of an electrical connector.

2. Description of the Related Art

It is known to all in connector field that electrical connector is used to electrically connect two electronic equipments, such as a semiconductor package and a circuit board, by conduct terminals received therein, so the contacting quality of the terminals with the electronic equipments will influence whole performance of the electrical connector.

A conventional electrical connector comprises a body, a top inserting portion assembled upon the body, a bottom inserting portion assembled below the body, a locking member mounted to the top inserting portion, a frame mounted to the top inserting portion and defining a receiving space, and a actuate member assembled to the body for operating the locking member. To make sure that the semiconductor package well electrically contacts with the terminals in the body, a size of the receiving space of the frame equal to a size of the semiconductor package which is positioned in the electrical connector by the frame. So, when another semiconductor package with a different size is concerned, we must replace with another electrical connector, that will enhance product cost and working intensity.

Another conventional electrical connector comprises a body, a top inserting portion assembled upon the body, a bottom inserting portion assembled below the body, a locking member mounted to the top inserting portion, a frame mounted to the top inserting portion and defining a receiving space and a actuate member assembled to the body for operating the locking member. To reduce the product cost and working intensity, the size of the receiving space of the frame is bigger than that of the semiconductor package. The semiconductor package electrically connect with tin balls of the terminals by a conduct pad disposed on a bottom thereof. So that, the electrical connector can receive different sizes of semiconductor packages, however, the electrical connector has other shortage, such as the semiconductor package need to be accurately electrically contact with the terminals, for the semiconductor package is positioned by a connection of the tin balls and the semiconductor package, but this action is operated by manual work which easily causes errors and is inefficient.

SUMMARY OF THE INVENTION

An object of the invention is to provide a tool for help a semiconductor package accurately electrically with terminals in an electrical connector which is adapt for receiving different sizes semiconductor package.

To achieve the above-mentioned object, a tool for aligning a semiconductor package with an electrical connector, comprises a body defining a through hole, a funnelform casing being formed at bottom end of the center through hole for aligning and guiding the semiconductor package; a plurality of latching members assembled to the body, each having a latching portion for retaining the tool to the electrical connector.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
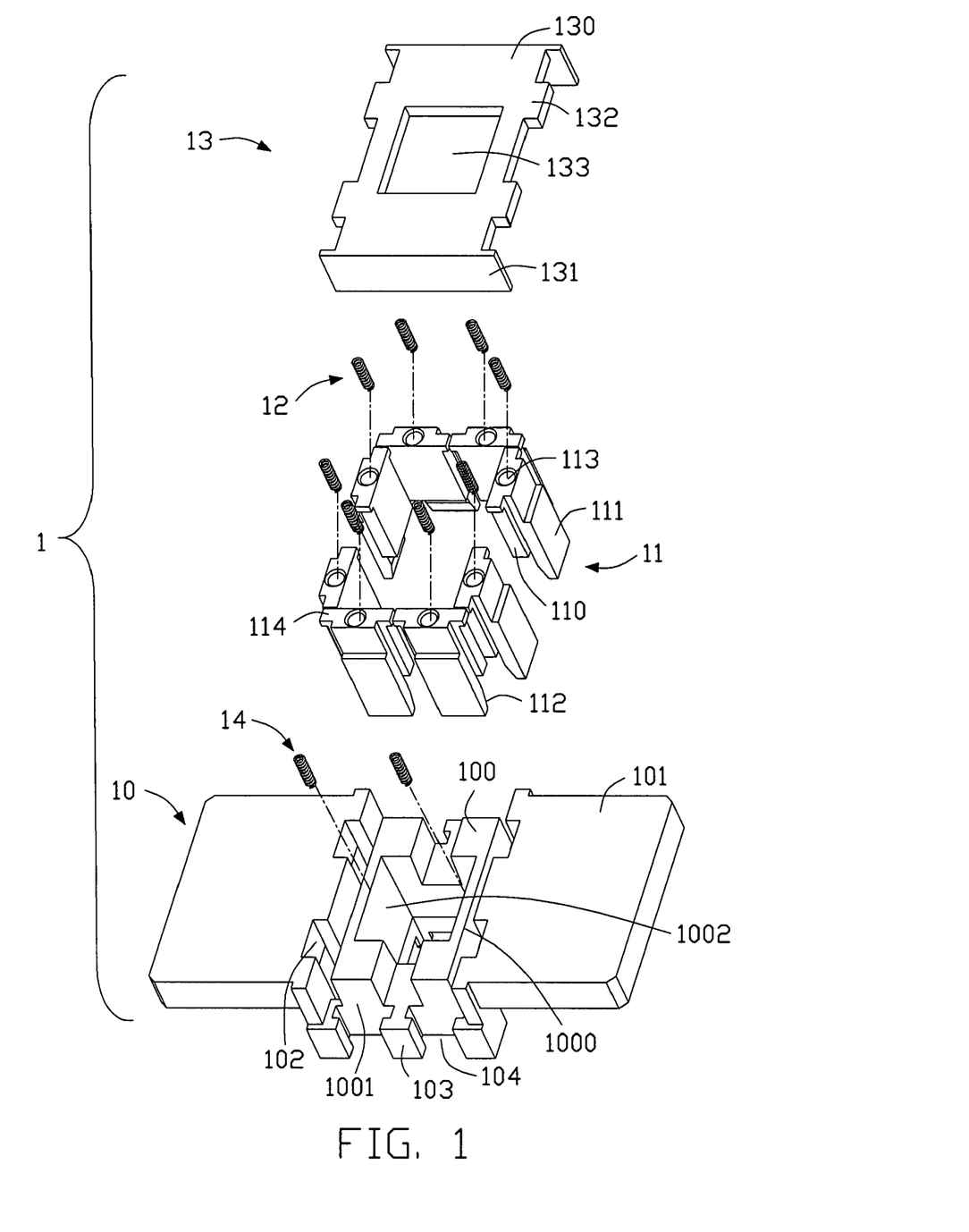
FIG. 1 is an exploded, perspective view of a tool of the present invention.
Figure 2:
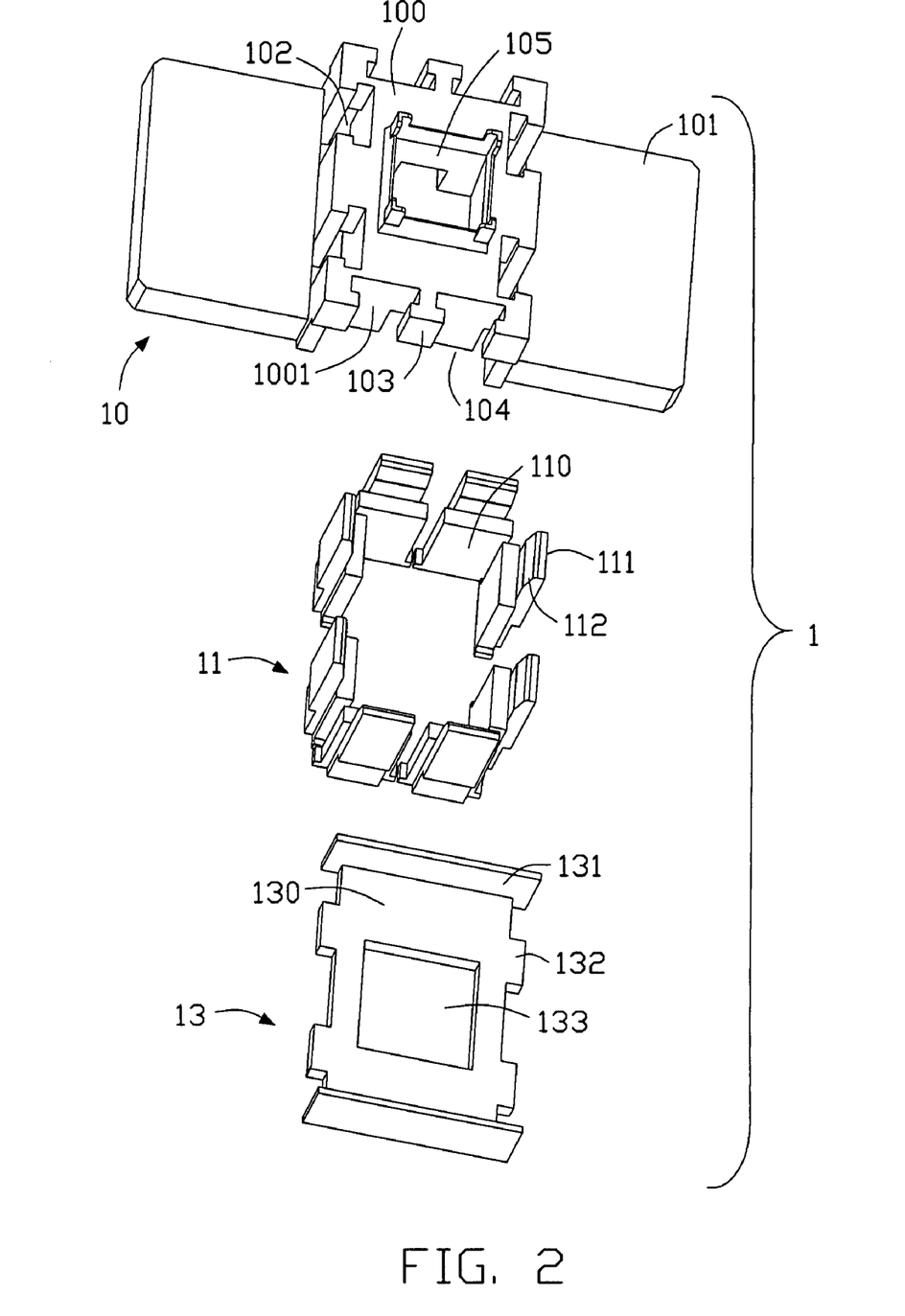
FIG. 2 is a partly exploded, perspective view of the tool of the present invention, taken from another side.
Figure 3:
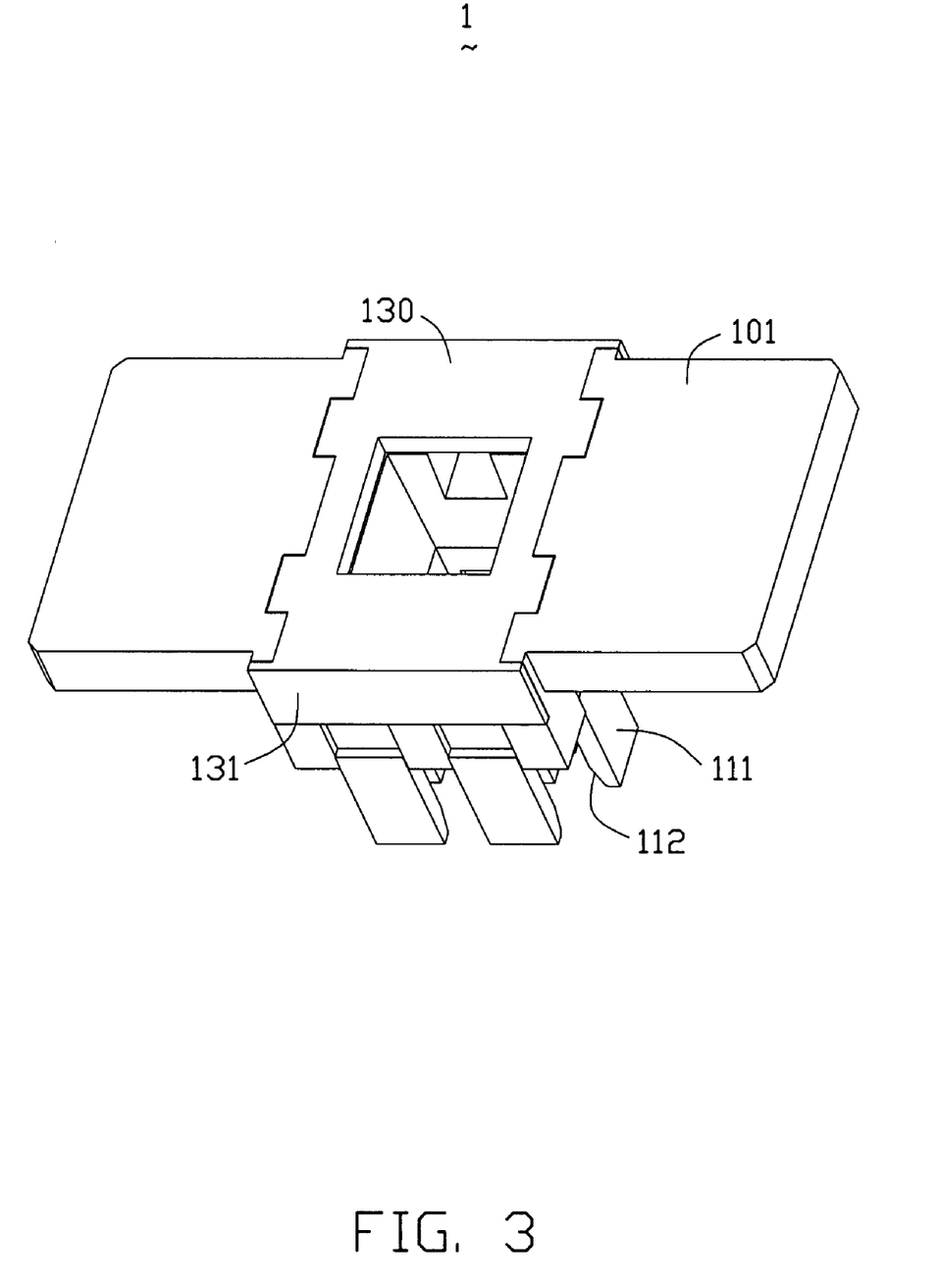
FIG. 3 is another assembled, perspective view of the tool of the present invention.
Figure 4:
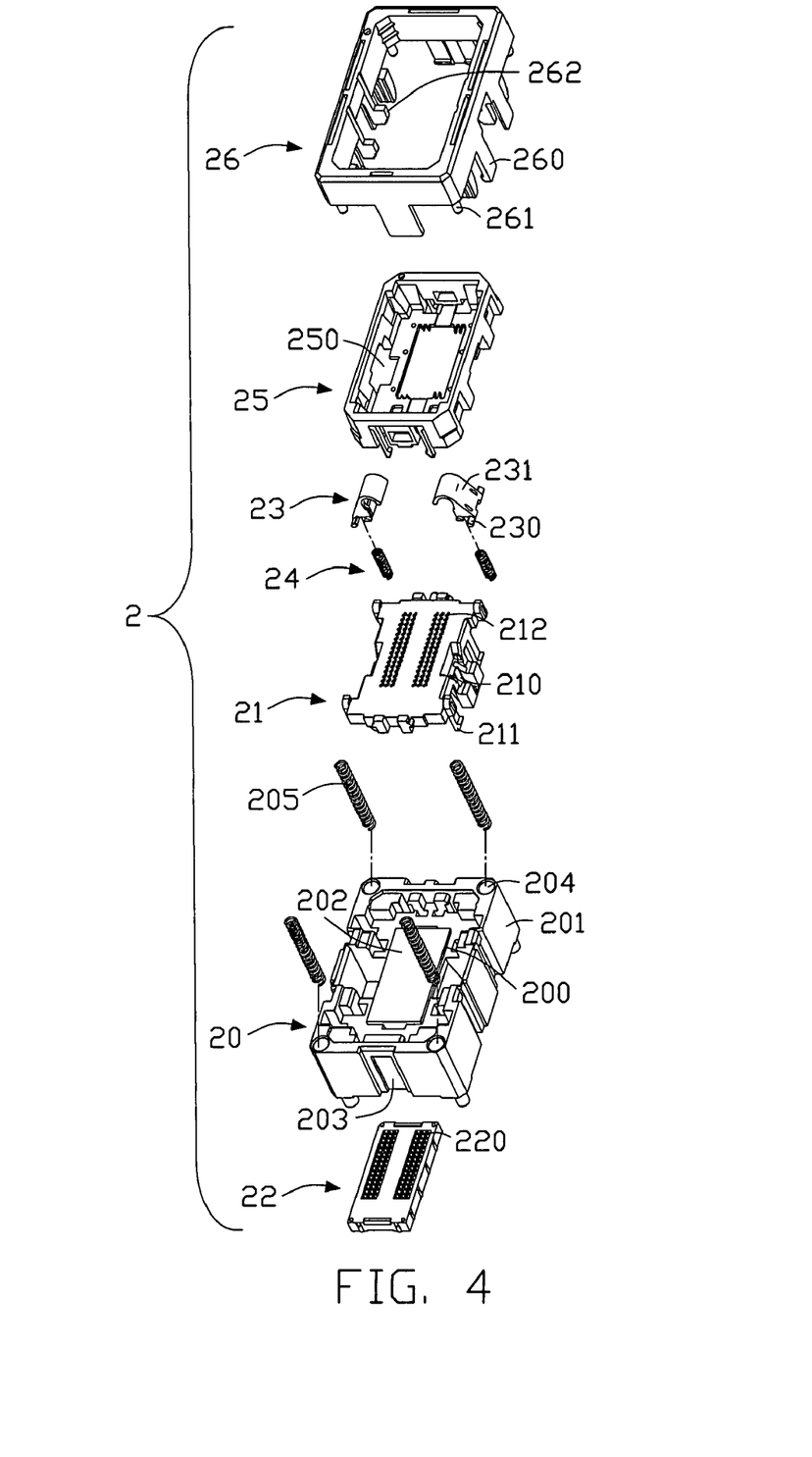
FIG. 4 is an exploded, perspective view of an electrical connector which may use the tool.
Figure 5:
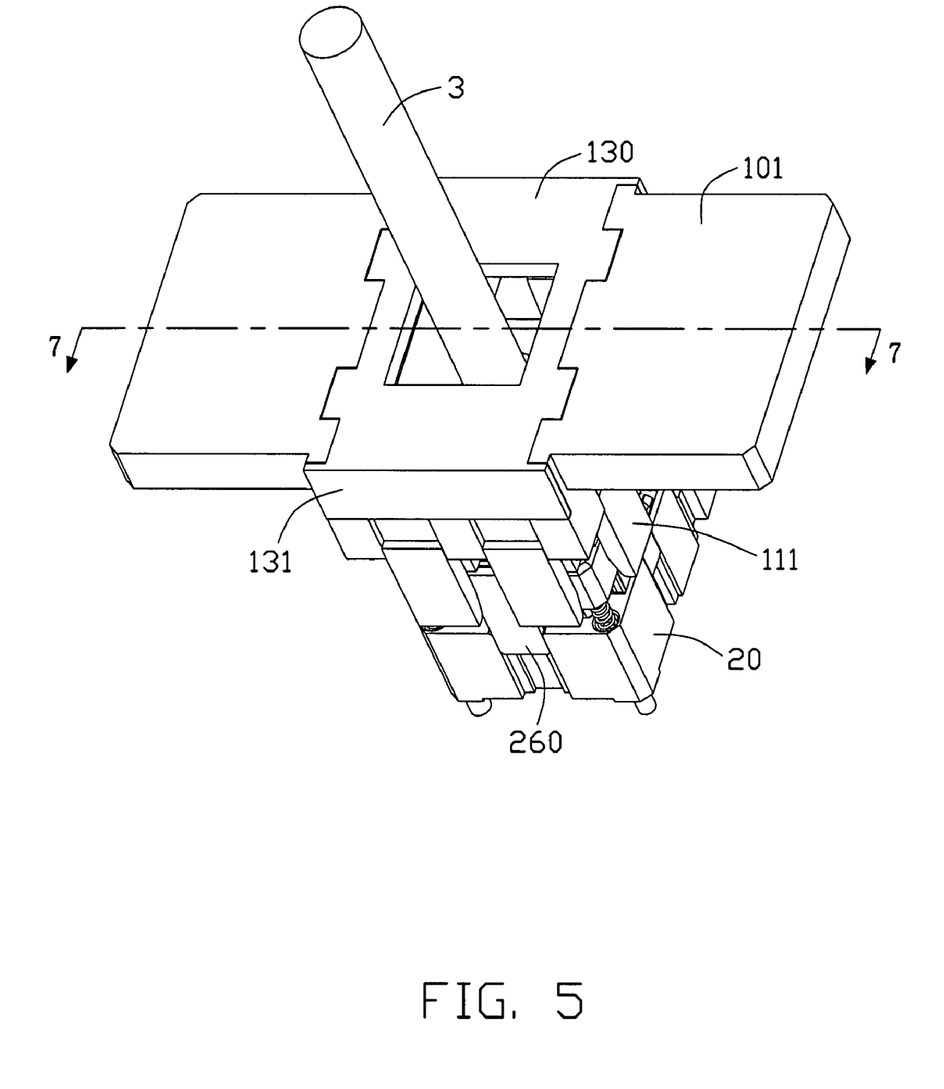
FIG. 5 is a perspective view of the tool mounted to the electrical connector; wherein a locking member of the electrical connector is in a close state.
Figure 6:
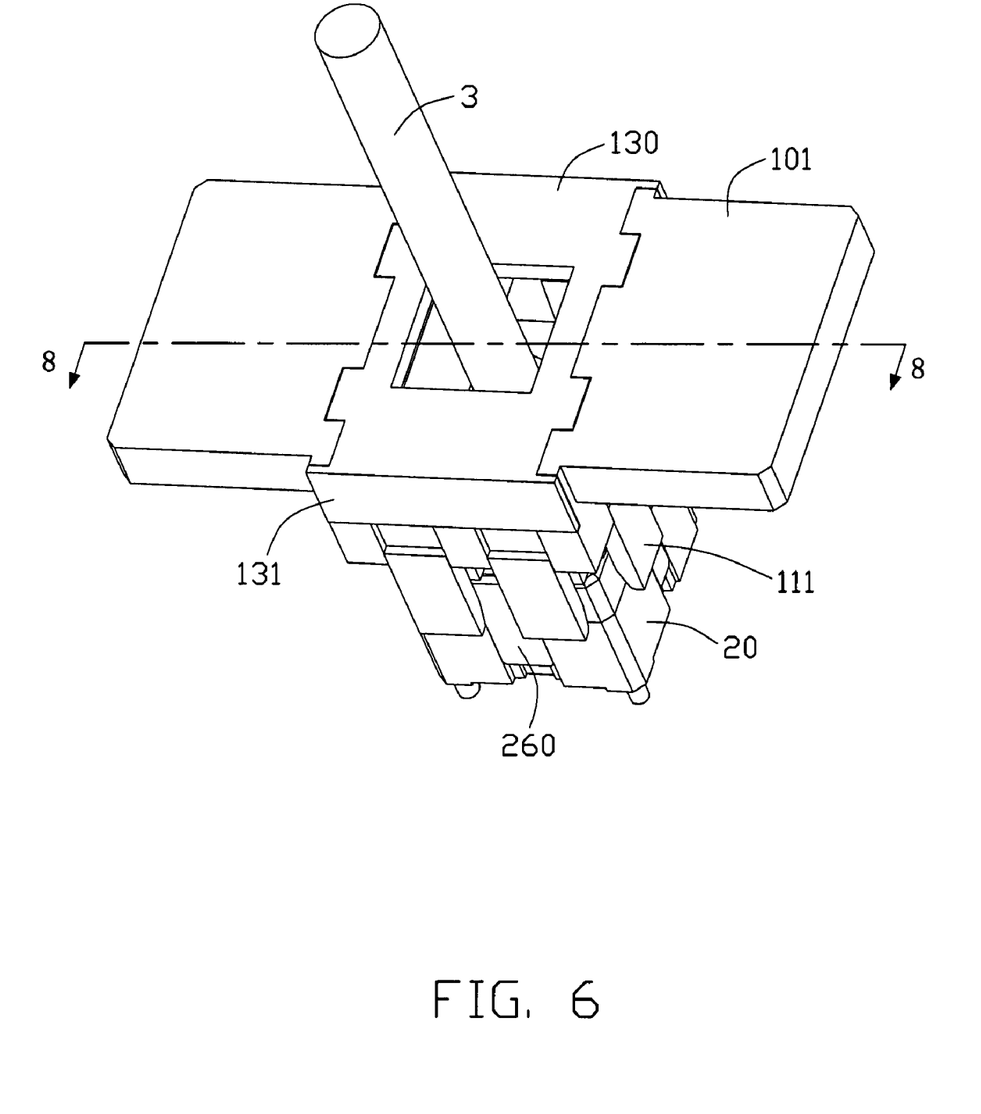
FIG. 6 is similar to FIG. 5, except that the locking member is in an open state.
Figure 7:
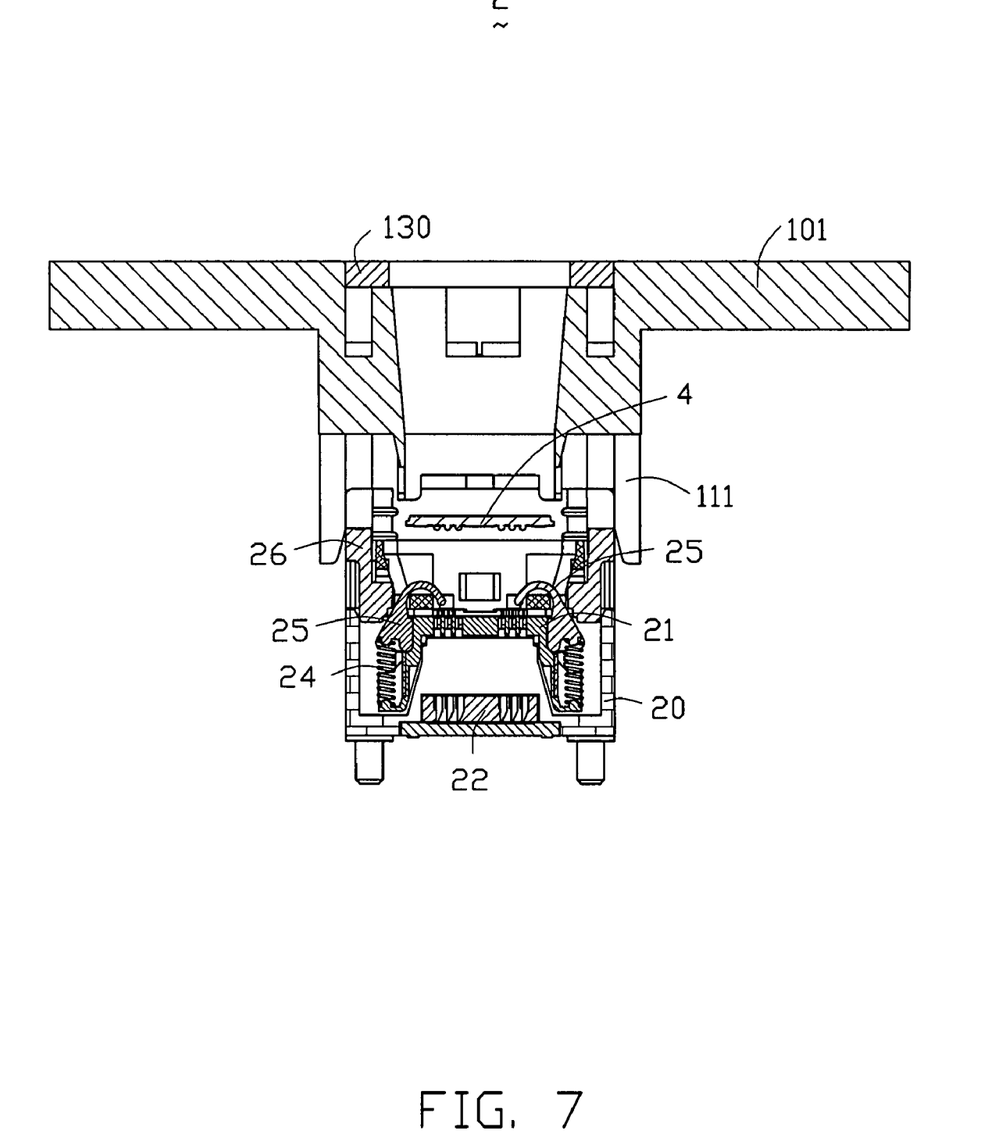
FIG. 7 is a cross sectional view taken from line 7-7 in FIG. 5, wherein a vacuum sucker in FIG. 5 is not shown.
Figure 8:
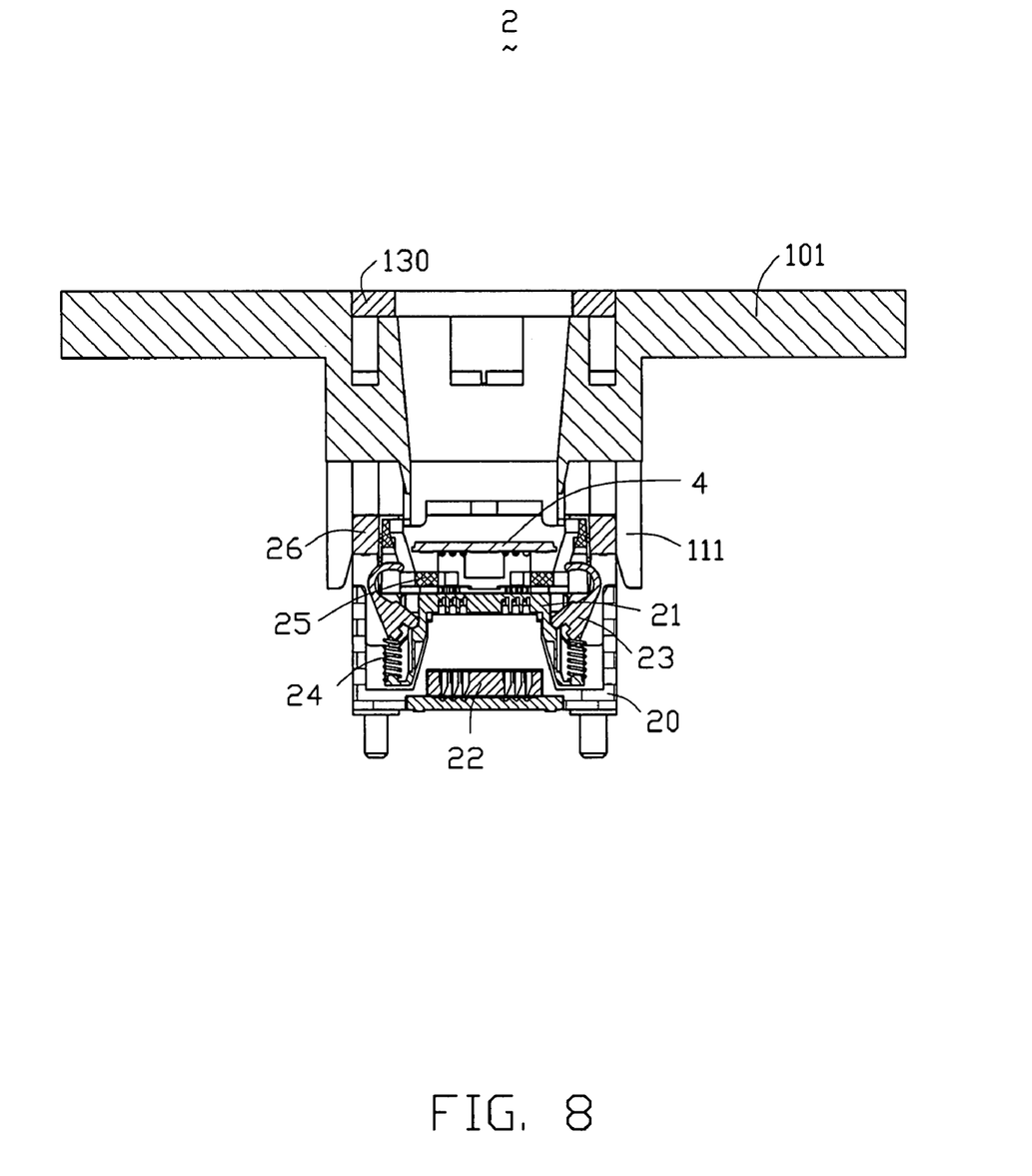
FIG. 8 is another cross sectional view taken from line 8-8 in FIG. 6, wherein the vacuum sucker in FIG. 5 is not shown.

Referring to FIGS. 1 to 3, conjoined with FIG. 7, a tool 1 used for a semiconductor package accurately electrically connecting with terminals of an electrical connector 2 and a vacuum sucker 3 are disclosed. Referring to FIG. 4, the electrical connector 2 comprises an insulating housing 20, a top inserting portion 21 disposed upon the insulating housing 20, a bottom inserting portion 22 disposed below the insulating housing 20, a locking member 23 assembled to the top inserting portion 21, third springs 24 located below the locking member 23, a frame 25 disposed to the top inserting portion 21 and an actuator 26 assembled to the insulating housing 20 for operating the locking member 23.

The insulating housing 10 is substantively in a square shape, and has a bottom wall 200, sidewalls 201 and a receiving space 202 defined by the bottom wall 200 and the sidewalls 201. The bottom wall 200 defines a plurality of center terminal holes (not shown) arranged in matrix in a center part thereof, the sidewalls 201 define a plurality of channels 203 on outside surfaces, the actuator 26 is able to move up and down along the channels 203, the insulating housing 20 has engaging holes 204 on four corners thereof which are used for receiving fourthly springs 205.

The top inserting portion 21 is received in the receiving space 202 of insulating housing 20, and defines a receiving slot 210 between center parts of opposed side thereof. The opposed sidewalls of the receiving slot 210 respectively have a orifice (not labeled) for retaining the locking member 23, a pair of clasps 211 are disposed adjacent to the receiving slots 210 and extend out to retain the top inserting portion 21 to the insulating housing 20, the top inserting portion 21 defines a plurality of top terminal holes 212 corresponding to center terminal holes (not shown) of the insulating housing 20. The bottom inserting portion 22 is received in the receiving space 202 of the insulating housing 20, and defines a plurality of bottom terminal holes 220 corresponding to center terminal holes (not shown) of the insulating housing 20.

The locking member 23 is set in the receiving slot 210 of the top inserting portion 21, and comprises a pivot 230 disposed on two side of a bottom edge thereof and a locking portion 231 extending along the bottom edge. The pivot 230 may insert into the orifice (not labeled) of the receiving slot 210 of the top inserting portion 21. The locking portion 231 has a recurved end. The frame 25 for receiving a semiconductor package 4 and has a accepting portion 250 corresponding to the locking porting 231 of the locking member 23 for the locking member 23 passing through. The actuator 26 is in a case shape, and has a plurality of protruding boards 260 vertically extending from circumference thereof for engaging with the channels 203, the actuator 26 has pins 261 on four corners thereof which are corresponding to and able to insert into the engaging holes 204 of the insulating housing 20 and engage with the fourth springs 205. The actuator 26 has a pressure portion 262 to press the locking member 23 during an up and down movement of the actuator 26 to change state of the locking member 23 from close to open.

When assembly, the top inserting portion 21 and the bottom inserting portion 22 are respectively installed in the insulating housing 20, with the top terminal holes being aligned to corresponding bottom terminal holes; Then, the locking member 23 is assembled to the receiving slot 210 of the top inserting portion 21, the pivot 230 inserts into the orifice on the sidewall of the receiving slot 210, the locking portion 231 locks with the top inserting portion 21; After that, the frame 25 and the actuator 26 are assembled upon the top inserting portion 21 by turn and make the protruding portion 262 of the actuator 26 is located upon the channels 203 on out sidewall of the insulating housing 20, the pins 261 in four corners are inserted into the engaging holes 204 of the insulating housing 20 and engage with the fourth springs 205 received in the engaging holes 204, the pressure portion 262 abuts against the locking member 23. When pressing the actuator 26, the pins 261 of the actuator 26 move downwardly acted by the fourth springs 205, the pressure portion 262 operates the locking member 23 to change the locking member 23 from the close state to the open state and to make the semiconductor package 4 electrically contact with the terminals. The tool 1 is used to complete a step of the semiconductor package 4 currently electrically contacting with the terminals, details as following.

The tool 1 comprises a body 10, a plurality of latching members 11 mounted on the body 10, first springs 12 received in the latching members 11, a backboard 13 retained to the body 10, and second springs 14 disposed between the backplane 13 and the body 10. The body 10 has a main body 100 comprising a pair of first side edges 1000 and a pair of second side edges 1001 vertical to and adjacent to the first side edges 1000 and a pair of board-like members 101 respectively extending from corresponding first side edge 1000 and away the main body 100. The main body 100 defines a center though hole 1002, the board-like member 101 has a notch (not labeled) for engaging with the backplane 13 on an end thereof near the main body 100. A plurality of through grooves 102 are defined at a connection portion of the main body 100 and the board-like member 101, the opposed second side edges 1001 are formed with a plurality of projections 103, two adjacent projections 103 defining a flute 104 therebetween. The main body 100 has a casing 105 extending from an end of the center though hole 1002, the casing 105 is in a funnelform shape with a big top and a small bottom, and the smallest section of the casing 105 has same size with the semiconductor package 4, so the semiconductor package 4 can easily electrically contact with the terminals by putting the semiconductor package 4 in the frame 5.

The latching members 11 are divided into first latching members and second latching members, each comprising a longitudinal retaining portion 110 and a latching portion 111 extending from a center part of the retaining portion 110 along a longitudinal direction. The latching portion 111 defines an incline face 112 for making the tool 1 favorably latch the electrical connector 2 on a face toward the retaining portion 110 thereof, the retaining portion 110 has accepting holes 113 for accepting the first springs 12 and extending portions 114 transversely extending from two ends of the retaining portion 110 to retained the latching member 11 to the body 10.

The backplane 13 is in a square shape and comprises a plane 130, a pair of arms 131 vertically extending from two sides of the plane 130, and a protruding board 132 protruding from another side of the plane 130, the plane 130 defines a peristome 133 with a same size with the center though hole 1002 of the main body 100.

When assembly, first, the latching member 11 retained in the body 10, the first latching member retained in the through groove 102 of the board-like member 101, the second latching portion retained on the flute 104 on the second side of the main body 100, the extending portion 114 of the first latching portion is disposed on the board-like member 101, the latching portion 111 extending out of the through groove 102, the extending portion 114 of the second latching member is disposed on the projections 103 of the second sidewall 1001 of the main body 100, the latching portion 111 also extending out of the flute 104, and then the first spring s are put in the accepting hole 13, at final, the back plane 13 is mounted to the body 10, the protruding board 132 of the back plane 13 is received on the through groove 102 of the body 10, and the arms retained to the sides of the body 10.

Referring to FIGS. 5-8, the tool 1 is mounted on the electrical connector 2, a vacuum sucker 3 sucks a body of the semiconductor package 4 and put the semiconductor package 4 in the funnelform casing 105 of the tool 1. When the electrical connector 2 does not actuated by the tool 1, the latching portions 111 of the latching members 11 of the tool 1 latch outsides of the actuator 26 of the electrical connector 2, the board-like member 101 of the body 10 locates on a top surface of the actuator 26, the locking members 23 are in the close state. When the backplane 13 of the tool 1 is pressed, the first springs 12 in the latching members 11 are compressed, and the latching members 11 are forced to make the retaining portions 110 press the actuator 26 of the electrical connector 2, at this moment, the locking members 23 are operated by the actuator 26 and compress the third springs 24 located below a bottom portion thereof, and change state of the locking member 23 from close to opening, and then, the semiconductor package 4 can move into the electrical connector 2 along the funnelform casing 105 of the tool 1 and currently electrically contacts with the terminals, then, remove the tool 1, the actuator 26 moves upwardly by resilience of the third springs 24, the locking members 23 change to the close state from the opening state and abut against the semiconductor package 4.

In this embodiment, the semiconductor package 4 can currently contact with the terminals of the electrical connector 2 by the funnelform tool 1, so operating personnel can easily complete this work. If the size of the semiconductor package 4 changes, we only need to change the tool 1 not the whole electrical connector 2, that will reduce product cost and assembly time, we even only need to change the body 10 and the backplane 13 of the tool 1 to make the center though hole 1002 and a peristome 133 with a same size with the changed semiconductor package 4.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An assembly for a semiconductor package comprising:
an electrical connector having an insulating housing and a plurality of terminals adapted for electrically connecting with the semiconductor package; and
a tool located upon the electrical connector and formed with a body having a through hole, and a funnelform casing formed at a bottom end of the through hole for aligning and guiding the semiconductor package into the electrical connector; wherein
the body comprises a main body and two board members extending from two opposed sides of the main body, the though hole is defined in the center of the main body.

2. The assembly of claim 1, wherein the tool further has a plurality of latching members assembled to the body, each latching member has a latching portion for retaining the tool to the electrical connector.

3. The assembly of claim 2, wherein the tool further comprises a back plane assembled upon the body of the tool, the back plane defines a peristome with a same size with the though hole of the body and is used to be pressed to bring the tool moving downwardly.

4. The assembly of claim 3, wherein the body of the tool defines a plurality of through grooves, the latching members insert into and are retained in corresponding through grooves, and the latching portions extend out of the through grooves.

5. The assembly of claim 4, wherein each latching member comprises a retaining portion, the latching portion extends from a center part of the retaining portion, the retaining portion has two extending portions transversely extending from two ends thereof to engage with the body.

6. The assembly of claim 5, further comprising a plurality of springs located between the latching members and the back plane, wherein the retaining portions of the latching member have a plurality of accepting holes for receiving the springs.

7. The assembly of claim 5, wherein the electrical connector defines a receiving space for the semiconductor package, and has a locking member defining a close state and an opening state relative to the receiving space.

8. The assembly of claim 7, wherein the back plane of the tool can downwardly compresses the springs and forces the retaining portion of the latching member which further actuates the locking member of the electrical connector to move from the close state to the opening state.

* * * * *